US006171878B1

(12) United States Patent
Fujimoto et al.

(10) Patent No.: US 6,171,878 B1
(45) Date of Patent: Jan. 9, 2001

(54) METHOD OF FABRICATING SEMICONDUCTOR LASER USING SELECTIVE GROWTH

(75) Inventors: Tsuyoshi Fujimoto; Yumi Naito; Atsushi Okubo; Yoshikazu Yamada, all of Sodegaura (JP)

(73) Assignee: Mitsui Chemicals Inc., Tokyo (JP)

( * ) Notice: Under 35 U.S.C. 154(b), the term of this patent shall be extended for 0 days.

(21) Appl. No.: 09/157,246

(22) Filed: Sep. 18, 1998

(30) Foreign Application Priority Data

Sep. 18, 1997 (JP) .................................................. 9-253884

(51) Int. Cl.$^7$ ...................................................... H01S 3/02
(52) U.S. Cl. ................ 438/46; 438/31; 372/45; 372/46
(58) Field of Search .................... 438/31, 44, 46, 438/47; 372/44, 45, 46, 47, 48

(56) References Cited

FOREIGN PATENT DOCUMENTS

| 0788203A1 | 8/1997 | (EP) . |
| 62-073687 | 4/1987 | (JP) . |
| 4370993 | 12/1992 | (JP) . |
| 4-370993 | * 12/1992 | (JP) . |
| WO9612328 | 4/1996 | (JP) . |

OTHER PUBLICATIONS

Applied Physics Letters, vol. 37, No. 3, pp. 262–263 (1980).
IEEE Journal Quantum Electronics, vol. 29, No. 6, pp. 1889–1893 (1993).

* cited by examiner

Primary Examiner—Chandra Chaudhari
Assistant Examiner—Keith Christianson
(74) Attorney, Agent, or Firm—Birch, Stewart, Kolasch, Birch, LLP

(57) ABSTRACT

In a self-aligned structure semiconductor laser in which a pair of optical guide layers are respectively formed on both faces of an active layer, the optical guide layers having a bandgap which is wider than that of the active layer, a pair of cladding layers are formed so as to sandwich the active layer and the optical guide layers, the cladding layers having a bandgap which is wider than bandgap of the optical guide layers, a pair of carrier blocking layers are respectively formed between the active layer and the optical guide layers, the carrier blocking layers having a bandgap which is wider than bandgaps of the active layer and the optical guide layers, and a current blocking layer having a stripe-like window is embedded in at least one of the optical guide layers, the current blocking layer is formed by selective growth.

In this way, a window of a current blocking layer can be accurately formed and the fabrication yield can be improved while avoiding maleffects on other layers.

16 Claims, 8 Drawing Sheets

METHOD OF FABRICATING SEMICONDUCTOR LASER USING SELECTIVE GROWTH

BACKGROUND OF THE INVENTION

1. Field of the Invention

The present invention relates to a method of fabricating a semiconductor laser capable of operating at a high output power, which is preferably used in the fields of communication, laser medical treatment, laser beam machining, laser printers and the like.

2. Description of the Related Art

FIG. 6 is a view showing the configuration of an example of a self-aligned structure semiconductor laser with a separate confinement heterostructure (hereinafter, such a laser is referred to as an SCH-SAS LD). The laser is reported in IEEE Journal Quantum. Electronics., Vol. 29, No. 6, (1993) p1889–1993.

Referring to FIG. 6, a cladding layer 2 of n-AlGaAs, a quantum well active layer 5 of GaAs/AlGaAs, a cladding layer 9 of p-AlGaAs, and a contact layer 10 of p-GaAs are sequentially formed on an n-GaAs substrate 1. A current blocking layer 7 of n-AlGaAs is embedded in the cladding layer 9.

In the self-aligned structure semiconductor laser shown in FIG. 6, the current blocking layer 7 having a stripe-like window and a bandgap wider than that of the cladding layer 9, i. e., a refractive index lower than that of the cladding layer is embedded. Therefore, a refractive index difference is formed also in a direction (lateral direction) parallel to the quantum well active layer 5, so that laser light can be confined also in the lateral direction of the stripe. As a result, two dimensional real index structure is realized.

Japanese Unexamined Patent Publication JP-A 62-73687 (1987) discloses a self-aligned structure semiconductor laser in which upper and lower cladding layers are respectively formed on both faces of an active layer, a current blocking layer is formed on the upper cladding layer, a center portion of the current blocking layer is then removed away to form a stripe-like groove, and a third cladding layer is embededly grown.

Japanese Unexamined Patent Publication JP-A 4-370993 (1992) discloses a self-aligned structure semiconductor laser in which a refractive index difference is formed also in the lateral direction of a stripe by a current blocking layer having a refractive index lower than that of a cladding layer, and, in order to facilitate the regrowth of a stripe-like window of the current blocking layer, an optical guide layer is disposed between an active layer and the current blocking layer.

A thesis (Applied Physics Letters., Vol. 37, No. 3, (1980), p262–263) reports a self-aligned structure semiconductor laser in which a current blocking layer is made of a material having a bandgap narrower than that of an active layer, and laser light is laterally confined by optical absorption of the current blocking layer.

FIG. 7 is a view showing the configuration of an example of a self-aligned structure semiconductor laser with a perfect SCH (hereinafter, such a laser is referred to as a PSCH-SAS LD). This laser is disclosed in International Patent Publication WO96/12328 in the name of the assignee of the present application.

Referring to FIG. 7, a cladding layer 2 of n-AlGaAs, an optical guide layer 3 of n-AlGaAs, a carrier blocking layer 4 of n-AlGaAs, a quantum well active layer 5 of GaAs/AlGaAs, a carrier blocking layer 6 of p-AlGaAs, an optical guide layer 8 of p-AlGaAs, a cladding layer 9 of p-AlGaAs, and a contact layer 10 of p-GaAs are sequentially formed on an n-GaAs substrate 1. A current blocking layer 7 of n-AlGaAs is embedded in the optical guide layer 8.

In such a PSCH-SAS LD also, a refractive index difference is formed also in the lateral direction by the existence of the current blocking layer 7, and hence two dimensional real index structure is realized.

FIGS. 8A, 8B and 8C are views illustrating an example of a conventional method of fabricating the SCH-SAS LD. First, as shown in FIG. 8A, the cladding layer 2 of n-AlGaAs, the quantum well active layer 5 of GaAs/AlGaAs, and a part of the cladding layer 9 of p-AlGaAs are sequentially crystal-grown on the n-GaAs substrate 1. An n-AlGaAs layer 7a to be the current blocking layer 7 is then uniformly crystal-grown.

Next, as shown in FIG. 8B, a mask is formed in the lateral sides of a region where the center stripe-like window is to be formed, and the stripe-like window is opened in the n-AlGaAs layer 7a by wet etching by which crystals are not damaged, thereby forming the current blocking layer 7. Thereafter, the mask is removed away.

Next, as shown in FIG. 8C, the remaining part of the cladding layer 9 is crystal-grown, and the contact layer 10 of p-GaAs is then crystal-grown.

FIGS. 9A, 9B and 9C are views illustrating an example of a conventional method of fabricating the PSCH-SAS LD. First, as shown in FIG. 9A, the cladding layer 2 of n-AlGaAs, the optical guide layer 3 of n-AlGaAs, the carrier blocking layer 4 of n-AlGaAs, the quantum well active layer 5 of GaAs/AlGaAs, the carrier blocking layer 6 of p-AlGaAs, and a part of the optical guide layer 8 of p-AlGaAs are sequentially crystal-grown on the n-GaAs substrate 1. An n-AlGaAs layer 7a to be the current blocking layer 7 is then uniformly crystal-grown.

Next, as shown in FIG. 9B, a mask is formed in the lateral sides of a region where the center stripe-like window is to be formed, and the stripe-like window is opened in the n-AlGaAs layer 7a by wet etching by which crystals are not damaged, thereby forming the current blocking layer 7. Thereafter, the mask is removed away.

Next, as shown in FIG. 9C, the remaining part of the optical guide layer 8 is crystal-grown, and the cladding layer 9 of p-AlGaAs and the contact layer 10 of p-GaAs are then sequentially crystal-grown.

In such a SCH-SAS LD and a PSCH-SAS LD, in order to realize lateral light confinement and suppression of current spread so as to attain excellent single lateral mode oscillation, the current blocking layer must be located at a position close to the active layer as much as possible, and the width of the window through which a current passes must be formed so as to accurately coincide with the designed value.

In the conventional fabrication method, in the etching step of forming the stripe-like window in the current blocking layer, overetching in which even the active layer is etched away frequently occurs, thereby fabricating a problem in that a high yield cannot be attained.

As a technique that etching is controlled to a desired depth while preventing such overetching from occurring, known is a method in which an etching stop layer for automatically chemically stopping etching is formed below the current blocking layer. In the method, however, only the etching controllability in the depth direction is improved and the controllability in the lateral direction, i.e., the controllability of the window width of the current blocking layer is not improved. Since the window width of the current blocking layer affects the oscillation threshold and the stability of the lateral mode, the method using an etching stop layer is not sufficient for solving the problem.

SUMMARY OF THE INVENTION

It is an object of the invention to provide a method of fabricating a semiconductor laser in which a window of a current blocking layer in a self-aligned structure semiconductor laser can be accurately formed and the fabrication yield and the reliability can be increased while maleffects on other layers are avoided.

The invention provides a method of fabricating a self-aligned structure semiconductor laser comprising:

providing a pair of cladding layers respectively on both faces of an active layer, the cladding layers having a bandgap wider than that of the active layer; and embedding a current blocking layer having a stripe-like window in at least one of the cladding layers, wherein the blocking layer is formed by selective growth.

According to the invention, the formation of the current blocking layer by selective growth can exclude an etching step in which the process accuracy is low. Therefore, overetching of other layers such as the active layer can be surely eliminated, and the dimensions of the stripe-like window in the height and width directions can be accurately controlled with high reproducibility. Consequently, a semiconductor laser which is excellent in oscillation threshold and stability of the lateral mode can be fabricated with a high yield.

Further the invention provides a method of fabricating a self-aligned structure semiconductor laser comprising:

providing an optical guide layer formed on one face or a pair of optical guide layers on both faces of an active layer, respectively, the optical guide layer(s) having a bandgap wider than that of the active layer;

providing a pair of cladding layers so as to sandwich the active layer and the optical guide layer(s) therebetween, the cladding layers having a bandgap wider than that of the optical guide layer; and embedding a current blocking layer having a stripe-like window between at least one of the cladding layers and the optical guide layer(s), wherein the current blocking layer is formed by selective growth.

According to the invention, the formation of the current blocking layer by selective growth can exclude an etching step in which the process accuracy is low. Therefore, overetching to the other layers such as the active layer can be surely eliminated, and the dimensions of the stripe-like window in the height and width directions can be accurately controlled with high reproducibility. Consequently, a semiconductor laser which is excellent in oscillation threshold and stability of the lateral mode can be fabricated with a high yield.

Further the invention provides a method of fabricating a self-aligned structure semiconductor laser comprising:

providing an optical guide layer on one face or both faces of the active layer, the optical guide layers having a bandgap wider than that of the active layer;

providing a pair of cladding layers so as to sandwich the active layer and the optical guide layer therebetween, the cladding layers having a bandgap wider than that of the optical guide layer; and embedding a current blocking layer having a stripe-like window in at least one of the optical guide layer, wherein the current blocking layer is formed by selective growth.

According to the invention, the formation of the current blocking layer by selective growth can exclude an etching step in which the process accuracy is low. Therefore, overetching to the other layers such as the active layer can be surely eliminated, and the dimensions of the stripe-like window in the height and width directions can be accurately controlled with high reproducibility. Consequently, a semiconductor laser which is excellent in oscillation threshold and stability of the lateral mode can be fabricated with a high yield.

Further the invention provides a method of fabricating a self-aligned structure semiconductor laser with perfect separated confinement hetero structure comprising:

providing a pair of optical guide layers respectively on both faces of an active layer, the optical guide layers having a bandgap wider than that of the active layer;

providing a pair of cladding layers so as to sandwich the active layer and the optical guide layers therebetween, the cladding layers having a bandgap wider than that of the optical guide layers:

providing carrier blocking layers respectively between the active layer and the optical guide layers, the carrier blocking layers having a bandgap wider than those of the active layer and the optical guide layers; and embedding a current blocking layer having a stripe-like window embedded in at least one of the optical guide layers, wherein the current blocking layer is formed by selective growth.

According to the invention, the formation of the current blocking layer by selective growth can exclude an etching step in which the process accuracy is low. Therefore, overetching to the other layers such as the active layer, optical guide layer or carrier blocking layer can be surely eliminated, and the dimensions of the stripe-like window in the height and width directions can be accurately controlled with high reproducibility. Consequently, a semiconductor laser which is excellent in oscillation threshold and stability of the lateral mode can be fabricated with a high yield.

In the invention it is preferable that the current blocking layer is formed of $Al_xGa_{1-x}As$ having an Al composition x of $0 \leq x \leq 0.35$ or a semiconductor material free of aluminum.

In the selective growth, it is very important to control the Al composition as low as possible. In the case of high Al composition, since Al is chemically active, growth occurs also on the selective growth mask, which makes the selective growth very hard to occur. Particularly, in the selective growth of $Al_xGa_{1-x}As$, an Al composition x of more than 0.35 causes the growth on the selective growth mask, and as a consequence the selective growth hardly occurs.

According to the invention, since the current blocking layer is formed of $Al_xGa_{1-x}As$ having an Al composition x of $0 \leq x \leq 0.35$, or a semiconductor material free of aluminum, the selective growth of the current blocking is easy to occur. Consequently, the current blocking layer is formed by such a simple selective growth, and a semiconductor laser which is excellent in oscillation threshold and stability of the lateral mode can be easily fabricated with a high yield.

Incidentally, the semiconductor material free of aluminum is preferably GaAs, InGaP, InGaAsP or the like in view of simplicity of the selective growth.

In the invention it is preferable that the optical guide layers are formed of $Al_xGa_{1-x}As$ having an Al composition x of $0<x\leq 0.3$.

The self-aligned structure semiconductor laser of a real refractive index waveguide type requires a refractive index difference between inner and outer sides of a stripe in a direction parallel to the active layer. In the case of fabricating the self-aligned structure semiconductor laser from $Al_xGa_{1-x}As$ in which crystal growth easily occurs, for the automatic lattice-matching with the GaAs substrate, real refractive index structure can be caused by making the Al composition of the current blocking layer higher than that of the optical guide layer. Incidentally, in $Al_xGa_{1-x}As$, the higher the Al composition, the lower the refractive index is.

On the contrary, in the case where the optical guide layer is formed of $Al_xGa_{1-x}As$ having a low Al composition, it is possible to control the Al composition of the current blocking layer formed of $Al_xGa_{1-x}As$ low. Reducing of the Al composition of the current blocking layer is very important in the selective growth of the current blocking layer. In the case of high Al composition, since aluminum is chemically active, growth also occurs on the mask for selective growth and as a consequence the selective growth is hard to occur. For example, in the selective growth of $Al_xGa_{1-x}As$, since growth occurs also on the mask when the Al composition x exceeds 0.35, the selective growth is hard to occur.

According to the invention, it is preferable that the optical guide layer has an Al composition x of $0<x\leq 0.3$, whereby the aluminum composition of the current blocking layer can be reduced. Consequently, the current blocking layer is formed by such a simple selective growth, and a semiconductor laser which is excellent in oscillation threshold and stability of the lateral mode can be fabricated with a high yield.

In a perfect separate confinement hetero structure, providing the carrier blocking layer offers further flexibility in design of the optical guide layer, so that various semiconductor materials can be used. In the case where $Al_xGa_{1-x}As$ is used, it is possible to form the optical guide layer or current blocking layer having a lower Al composition, since carrier blocking layers effectively confine the carrier in the active layer.

Furthermore, in the case where the optical guide layer of the perfect separate confinement hetero sructure is formed to have an Al composition x of $0<x\leq 0.3$, a sufficient refractive index difference can be caused in the lateral direction even in the current blocking layer having an Al composition x of $x\leq 0.35$ where the selective growth would easily occur. Accordingly the current blocking layer can be formed by such a simple selective growth, and a semiconductor laser which is excellent in oscillation threshold and stability of the lateral mode can be fabricated with a high yield.

Further in the invention, it is preferable that the optical guide layers are formed of a semiconductor material free of aluminum.

In the self-aligned structure semiconductor laser, if the crystal properties of the current blocking layer crystal-grown on the optical guide layer and subsequent layers formed thereon are reduced, the reliability of a semiconductor laser device thus fabricated is impaired. Furthermore, it is necessary to suppress the reduction in crystal property of each layer to be grown later at the current injection stripe-like window and prevent the formation of a barrier at the growth interface so as to facilitate the injection of current.

According to the invention, since the optical guide layer is formed of a semiconductor material free of aluminum, deterioration of the surface of the optical guide layer due to oxidation during the fabricating process can be suppressed. Therefore, in addition it is possible to improve the crystal properties of the current blocking layer and each layer subsequently formed. Furthermore, formation of the barrier at the current injection stripe-like window is avoided. Consequently, a semiconductor laser which is easy to crystal-grow, excellent in reliability, oscillation threshold and stability of the lateral mode can be fabricated with a high yield.

Further in the invention it is preferable that the semiconductor material free of aluminum for forming the optical guide layers is GaAs.

According to the invention, since the optical guide layer is formed of GaAs, deterioration of the surface of the optical guide layer due to oxidation during the fabricating process can be suppressed. Therefore, in addition it is possible to improve the crystal properties of the current blocking layer and each layer subsequently formed. Furthermore, formation of the barrier at the current injection stripe-like window is avoided. Moreover, as described above, the selective growth of the current blocking layer is facilitated. Consequently, a semiconductor laser which is easy to crystal-grow, excellent in reliability, oscillation threshold and stability of the lateral mode can be fabricated with a high yield.

Further in the invention it is preferable that the method further comprises providing a substrate of GaAs, and the semiconductor material free of aluminum for forming the optical guide layers is InGaP or InGaAsP which can lattice-match with GaAs.

According to the invention, since the optical guide layer is formed of InGaP or InGaAsP, the deterioration due to oxidation during the process can be avoided as in the case of GaAs. As a result of this, it is possible to avoid formation of the barrier which will maleffect on the current injection at the regrowth interface of the stripe-like window. Furthermore, crystal properties of layers such as the current blocking layer grown on the optical guide layer are improved. Furthermore, the optical guide layer lattice-matches with the substrate of GaAs desirably, and the crystal stability of the whole device is improved. Consequently, a semiconductor laser which is excellent in reliability, oscillation threshold and stability of the lateral mode can be fabricated with a high yield.

Further in the invention it is preferable that the method further comprises forming a protective layer of a semiconductor material free of aluminum between the optical guide layer and the current blocking layer.

According to the invention, since the protective layer of a semiconductor layer free of Al is formed between the optical guide layer and the current blocking layer, deterioration due to the oxidation during the process can be avoided. As a result, it is possible to avoid formation of the barrier which will maleffect on the current injection at the regrowth interface of the stripe-like window. Furthermore, crystal properties of layers grown on the optical guide layer, such as the current blocking layer is improved. Consequently, a semiconductor laser which is excellent in reliability, oscillation threshold and stability of the lateral mode can be fabricated with a high yield.

Further in the invention it is preferable that the semiconductor material free of aluminum for forming the protective layer is GaAs.

According to the invention, since the protective layer formed of GaAs is formed between the optical guide layer and the current blocking layer, in addition to affording an excellent growth property of GaAs, the above-mentioned problems of the deterioration due to the oxidation during the process and the barrier formation at the stripe-like window can be surely avoided. Furthermore, crystal properties of layers grown on the optical guide layer, such as the current blocking layer is improved. Consequently, a semiconductor laser which is excellent in reliability, oscillation threshold and stability of the lateral mode can be fabricated with a high yield.

Further in the invention it is preferable that the method further comprises providing a substrate of GaAs, and the semiconductor material free of aluminum for forming the protective layer is InGaP or InGaAsP which can lattice-match with GaAs.

According to the invention, since the protective layer is formed of InGaP or InGaAsP capable of lattice-matching with GaAs, deterioration due to the oxidation during the process can be avoided. As a result, it is possible to avoid formation of the barrier which will maleffect on the current injection at the regrowth interface of the stripe-like window. Furthermore, crystal properties of layers grown on the optical guide layer, such as the current blocking layer is improved. Furthermore, the optical guide layer lattice-aligns with the substrate of GaAs desirably, and the crystal stability of the whole device is improved. Consequently, a semiconductor laser which is excellent in reliability, oscillation threshold and stability of the lateral mode can be fabricated with a high yield.

In the invention it is preferable that the active layer is formed of a GaAs quantum well.

According to the invention, a high-efficiency quantum well having a oscilating wavelength at which light absorption would not occur in the optical guide layer made of $Al_xGa_{1-x}As$ with an Al composition between 0 to 0.3 can be formed. Consequently, a semiconductor laser which is excellent in oscillation threshold and stability of the lateral mode can be fabricated in high yield.

Further in the invention it is preferable that the active layer is formed of an InGaAs quantum well.

According to the invention, a high-efficiency quantum well having such a oscilating wavelength that would not cause light absorption in the optical guide layer of GaAs can be formed. Consequently, a semiconductor laser which is excellent in oscillation threshold and stability of the lateral mode can be fabricated in high yield.

Further in the invention it is preferable that for the selective growth, one of MOCVD (metalorganic chemical vapor deposition method), MOMBE (metalorganic molecular beam epitaxy method), and MBE (molecular beam epitaxy method) is used.

According to the invention, a technique is employed in which a mask is previously formed in a region where the stripe-like window is to be formed, the current blocking layer is formed by using an MOCVD, an MOMBE, or an MBE, and the mask is then removed away. Because of this technique, the dimensions of the stripe-like window in the height and width directions can be accurately controlled with high reproducibility.

Further in the invention it is preferable that the selective growth comprises the steps of: forming a mask for selective growth on a layer on which the current blocking layer is to be formed; removing the mask for selective growth excluding a portion where the stripe-like window is to be formed; forming the current blocking layer through crystal growth all over the layer excluding the portion for the stripe-like window; and removing the mask for selective growth on the portion for the stripe-like window.

According to the invention, an etching step can be omitted, and the dimensions of the stripe-like window can be accurately controlled with high reproducibility.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENT

Figure 1A:
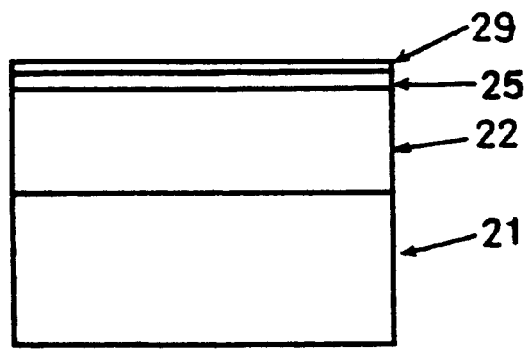
FIGS. 1A, 1B and 1C are section views showing fabrication steps of a first embodiment of the invention.

Now referring to the drawings, preferred embodiments of the invention are described below.

Figure 1B:
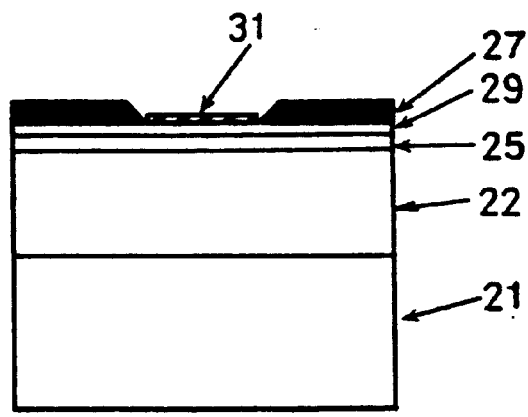
Figure 1C:
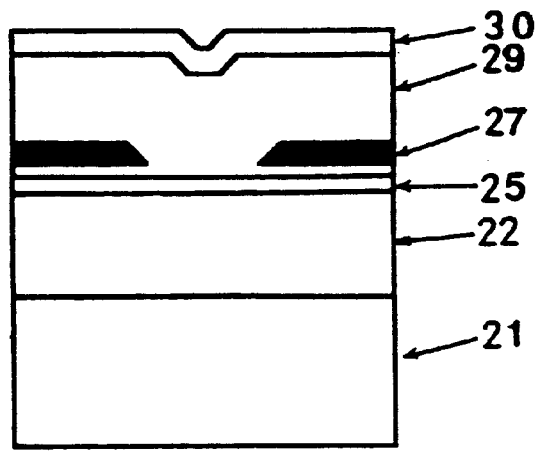

FIGS. 1A, 1B and 1C are section views showing fabrication steps of a first embodiment of the invention. As shown in FIG. 1A, first, a cladding layer 22 of n-$Al_{0.55}Ga_{0.45}As$ (thickness: 1.5 $\mu$m), a GaAs/$Al_{0.45}Ga_{0.55}As$ quantum well active layer 25 (oscillation wavelength: 780 nm), and a part of a cladding layer 29 of p-$Al_{0.55}Ga_{0.45}As$ (thickness: 0.20 $\mu$m) are sequentially crystal-grown on an n-GaAs substrate 21 by using an MOCVD or the like.

In an AlGaAs material, as the Al composition is higher, the bandgap tends to become wider. In the embodiment, the bandgap of the cladding layers 22 and 29 is wider than that of the quantum well active layer 25.

The substrate on which the crystal growth has been performed as described above is taken out from a crystal growth apparatus and then loaded into an electron beam evaporation apparatus or the like so that, as shown in FIG. 1B, a mask 31 of, for example, $SiO_2$ is formed on the whole surface at a thickness of 0.1 $\mu$m. Thereafter, the mask is removed away except a center portion where a stripe-like window is to be formed, by using the photolithography technique, thereby forming the mask 31 into a stripe-like shape. Since the mask 31 is very thin, the stripe-like mask can be accurately formed with high reproducibility, even by the conventional photolithography technique.

Next, the substrate on which the mask 31 is formed is returned to the crystal growth apparatus, and a current blocking layer 27 of n-GaAs (thickness: 0.80 $\mu$m) is selectively grown on the cladding layer 29. As a result, as shown in FIG. 1B, a layer structure in which crystal growth is not performed in the region where the mask 31 is formed is obtained.

Thereafter, the mask 31 is removed away by a hydrofluoric acid aqueous solution or the like. As shown in FIG. 1C, then, the remaining part (thickness: 1.5 $\mu$m) of the cladding layer 29 and a contact layer 30 of p-GaAs (thickness: 2.0 $\mu$m) are sequentially crystal-grown.

In this way, by using the technique in which the mask 31 is formed in the portion where the stripe-like window is to be formed, the current blocking layer 27 is then formed by selective growth, and the mask 31 is thereafter removed away, the dimensions of the stripe-like window of the current blocking layer 27 in the height and width directions can be accurately controlled with high reproducibility while suppressing maleffects on the layers such as the active layer 25. As a result of this selective growth of the current blocking layer 27, a self-aligned structure semiconductor laser which is excellent in oscillation threshold and stability of the lateral mode can be fabricated with a high yield.

The material of the mask 31 is not restricted to $SiO_2$. Any material such as SiN may be used as far as it can be selectively grown.

Figure 2A:
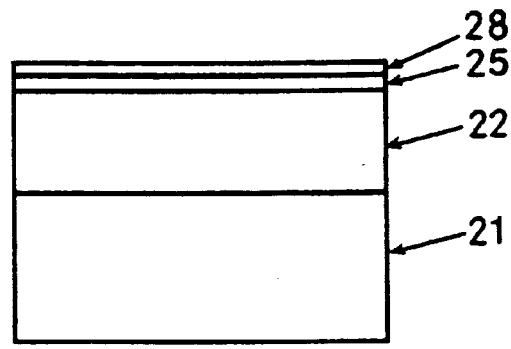
FIGS. 2A, 2B and 2C are section views showing fabrication steps of a second embodiment of the invention.
Figure 2B:
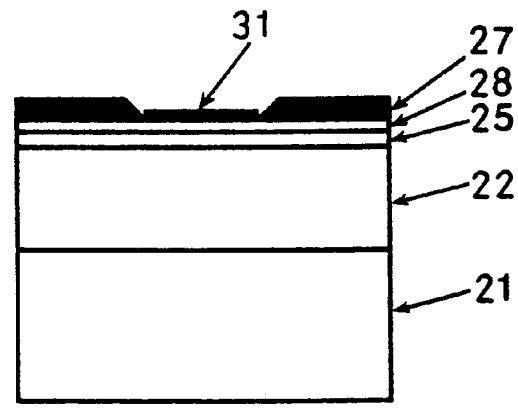
Figure 2C:
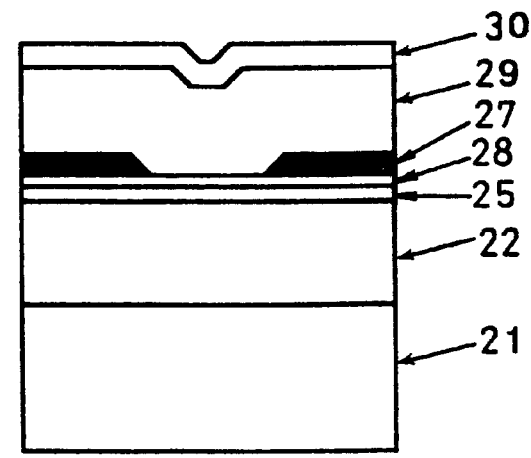

FIGS. 2A, 2B and 2C are section views showing fabrication steps of a second embodiment of the invention. As shown in FIG. 2A, first, a cladding layer 22 of n-$Al_{0.45}Ga_{0.55}As$ (thickness: 1.5 μm), a GaAs/$Al_{0.20}Ga_{0.80}As$ quantum well active layer 25 (oscillation wavelength: 860 nm), and an optical guide layer 28 of p-$Al_{0.30}Ga_{0.7}As$ (thickness: 0.10 μm) are sequentially crystal-grown on an n-GaAs substrate 21 by using an MOCVD or the like.

In an AlGaAs material, as the Al composition is higher, the bandgap tends to become wider. In the embodiment, the bandgap of the cladding layers 22 and 29 is wider than that of the quantum well active layer 25.

The substrate on which the crystal growth has been performed as described above is taken out from a crystal growth apparatus and then loaded into an electron beam evaporation apparatus or the like so that ,as shown in FIG. 2B, a mask 31 of, for example, $SiO_2$ is formed on the whole surface at a thickness of 0.1 μm. Thereafter, the mask is removed away except a center portion where a stripe-like window is to be formed, by using the photolithography technique, thereby forming the mask 31 into a stripe-like shape. Since the mask 31 is very thin, the stripe-like mask can be accurately formed with high reproducibility, even by the conventional photolithography technique.

Next, the substrate on which the mask 31 is formed is returned to the crystal growth apparatus, and a current blocking layer 27 of n-GaAs (thickness: 0.80 μm) is selectively grown on the cladding layer 29. As a result, as shown in FIG. 2B, a layer structure in which crystal growth is not performed in the region where the mask 31 is formed is obtained.

Thereafter, the mask 31 is removed away by a hydrofluoric acid aqueous solution or the like. As shown in FIG. 2C, then, the cladding layer 29 (thickness: 1.5 μm) and a contact layer 30 of p-GaAs (thickness: 2.0 μm) are sequentially crystal-grown.

In this way, by using the technique in which the mask 31 is formed in the portion where the stripe-like window is to be formed, the current blocking layer 27 is then formed by selective growth, and the mask 31 is thereafter removed away, the dimensions of the stripe-like window of the current blocking layer 27 in the height and width directions can be accurately controlled with high reproducibility while suppressing maleffects on the layers such as the active layer 25. As a result of this selective growth of the current blocking layer 27, a self-aligned structure semiconductor laser which is excellent in oscillation threshold and stability of the lateral mode can be fabricated with a high yield.

The material of the mask 31 is not restricted to $SiO_2$. Any material such as SiN may be used as far as it can be selectively grown.

Figure 3A:
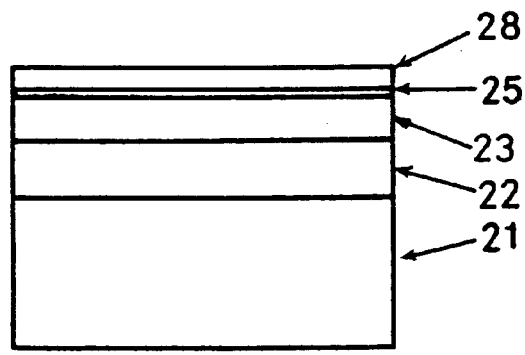
FIGS. 3A, 3B and 3C are section views showing fabrication steps of a third embodiment of the invention.
Figure 3B:
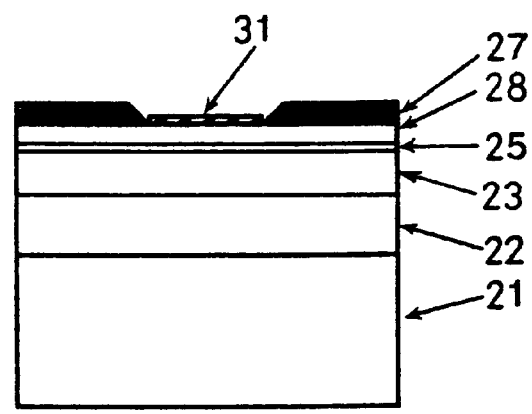
Figure 3C:
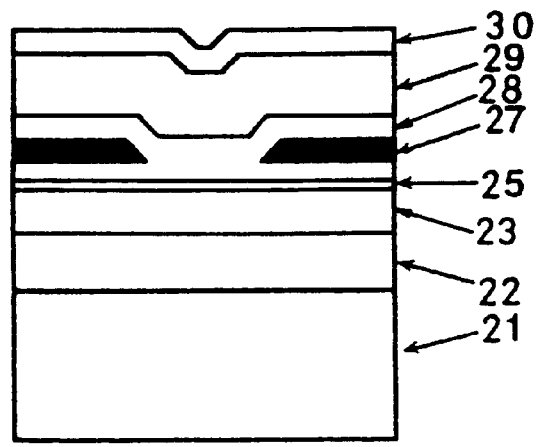

FIGS. 3A, 3B and 3C are section views showing fabrication steps of a third embodiment of the invention. As shown in FIG. 3A, first, a cladding layer 22 of n-$Al_{0.24}Ga_{0.76}As$ (thickness: 1.1 μm), an optical guide layer 23 of n-$Al_{0.20}Ga_{0.80}As$ (thickness: 0.88 μm), an $In_{0.20}Ga_{0.80}As$/Gas quantum well active layer 25 (oscillation wavelength: 980 nm), and a part of an optical guide layer 28 of p-$Al_{0.20}Ga_{0.80}As$ (thickness: 0.10 μm) are sequentially crystal-grown on an n-GaAs substrate 21 by using an MOCVD or the like.

In an AlGaAs material, as the Al composition is higher, the bandgap tends to become wider. In the embodiment, the bandgap of the optical guide layers 23, 28 is wider than that of the quantum well active layer 25, and the bandgap of the cladding layer 22 and a later-mentioned cladding layer 29 is wider than that of the optical guide layers 23, 28.

In this embodiment, the optical guide layer 23 is formed to be thicker than that in the conventional SCH-SAS semiconductor laser. Furthermore, the bandgap of the optical guide layer 23 is set to be sufficiently wider than that of the quantum well active layer 25, thereby preventing the carrier from overflowing to the optical guide layers 23, 28 from the active layer 25.

The substrate on which the crystal growth has been performed as described above is taken out from a crystal growth apparatus and then loaded into an electron beam evaporation apparatus or the like so that ,as shown in FIG. 3B, a mask 31 of, for example, $SiO_2$ is formed on the whole surface at a thickness of 0.1 μm. Thereafter, the mask is removed away except a center portion where a stripe-like window is to be formed, by using the photolithography technique, thereby forming the mask 31 into a stripe-like shape. Since the mask 31 is very thin, the stripe-like mask can be accurately formed with high reproducibility, even by the conventional photolithography technique.

Next, the substrate on which the mask 31 is formed is returned to the crystal growth apparatus, and a current blocking layer 27 of n-$Al_{0.33}Ga_{0.67}As$ (thickness: 0.1 μm) is selectively grown on the optical guide layer 28. As a result, as shown in FIG. 3B, a layer structure in which crystal growth is not performed in the region where the mask 31 is formed is obtained.

Thereafter, the mask 31 is removed away by a hydrofluoric acid aqueous solution or the like. As shown in FIG. 3C, then, the remaining part (thickness: 0.78 μm) of the optical guide layer 28 is crystal-grown, and further the cladding layer 29 of p-$Al_{0.24}Ga_{0.76}As$ (thickness: 1.1 μm) and a contact layer 30 of p-GaAs (thickness: 2.0 μm) are sequentially crystal-grown. The thickness of the optical guide layer at the stripe-like window is preferably 0.2 μm or more which is thicker than that of the conventional SCH-SAS LD.

In this way, by using the technique in which the mask 31 is formed in the portion where the stripe-like window is to be formed, the current blocking layer 27 is then formed by selective growth, and the mask 31 is thereafter removed away, the dimensions of the stripe-like window of the current blocking layer 27 in the height and width directions can be accurately controlled with high reproducibility while suppressing maleffects on the other layers such as the active layer 25. As a result of this selective growth of the current blocking layer 27, an SCH-SAS LD which is excellent in oscillation threshold and stability of the lateral mode can be fabricated with a high yield.

The material of the mask 31 is not restricted to $SiO_2$. Any material such as SiN may be used as far as it can be selectively grown.

Figure 4A:
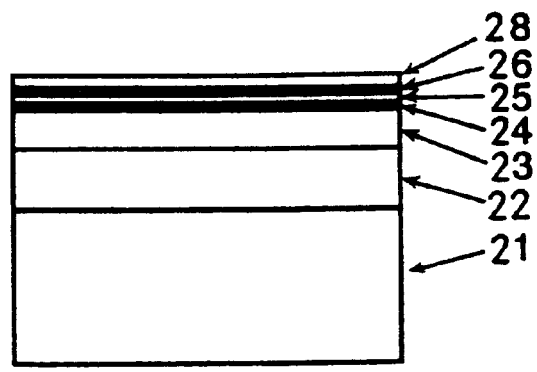
FIGS. 4A, 4B and 4C are section views showing fabrication steps of fourth and fifth embodiments of the invention.
Figure 4B:
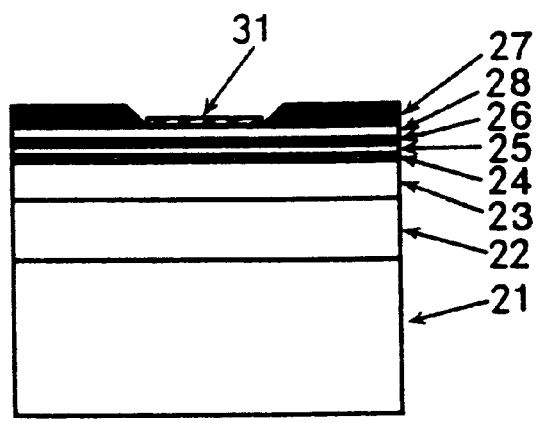
Figure 4C:
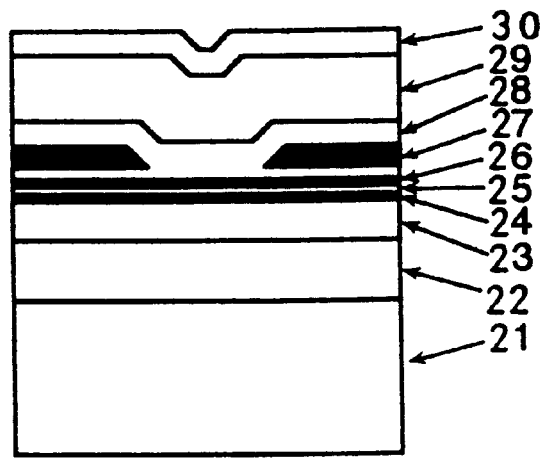

FIGS. 4A, 4B and 4C are section views showing fabrication steps of a fourth embodiment of the invention. As shown in FIG. 4A, first, a cladding layer 22 of n-$Al_{0.24}Ga_{0.76}As$ (thickness: 1.1 μm), an optical guide layer 23 of n-$Al_{0.20}Ga_{0.80}As$ (thickness: 0.88 μm), a carrier blocking layer 24 of an n-$Al_{0.50}Ga_{0.50}As$ (thickness: 0.025 μm), a GaAs/$Al_{0.20}Ga_{0.80}As$ quantum well active layer 25 (oscillation wavelength: 860 nm), a carrier blocking layer 26 of p-$Al_{0.50}Ga_{0.50}As$ (thickness: 0.025 μm) and a part of an optical guide layer 28 of p-$Al_{0.20}Ga_{0.80}As$ (thickness: 0.10 μm) are sequentially crystal-grown on an n-Gas substrate 21 by using an MOCVD or the like.

In an AlGaAs material, as the Al composition is higher, the bandgap tends to become wider. In the embodiment, the bandgap of the optical guide layers 23, 28 is wider than that of the quantum well active layer 25, and the bandgaps of the cladding layers 22, 29 and the carrier blocking layers 24, 26 are wider than that of the optical guide layers 23, 28.

The substrate on which the crystal growth has been performed as described above is taken out from a crystal growth apparatus and then loaded into an electron beam evaporation apparatus or the like so that ,as shown in FIG. 4B, a mask 31 of, for example, $SiO_2$ is formed on the whole surface at a thickness of 0.1 μm. Thereafter, the mask is removed away except a center portion where a stripe-like window is to be formed, by using the photolithography technique, thereby forming the mask 31 into a stripe-like shape. Since the mask 31 is very thin, the stripe-like mask can be accurately formed with high reproducibility, even by the conventional photolithography technique.

Next, the substrate on which the mask 31 is formed is returned to the crystal growth apparatus, and a current blocking layer 27 of n-$Al_{0.33}Ga_{0.67}As$ (thickness: 0.1 μm) is selectively grown on the optical guide layer 28. As a result, as shown in FIG. 4B, a layer structure in which crystal growth is not performed in the region where the mask 31 is formed is obtained.

Thereafter, the mask 31 is removed away by a hydrofluoric acid aqueous solution or the like. As shown in FIG. 4C, then, the remaining part (thickness: 0.78 μm) of the optical guide layer 28 is crystal-grown, and further the cladding layer 29 of p-$Al_{0.24}Ga_{0.76}As$ (thickness: 1.1 μm) and a contact layer 30 of p-GaAs (thickness: 2.0 μm) are sequentially crystal-grown.

In this way, by using the technique in which the mask 31 is formed in the portion where the stripe-like window is to be formed, the current blocking layer 27 is then formed by selective growth, and the mask 31 is thereafter removed away, the dimensions of the stripe-like window of the current blocking layer 27 in the height and width directions can be accurately controlled with high reproducibility while suppressing maleffects on the other layers such as the active layer 25 or the carrier blocking layer 26. As a result of this selective growth of the current blocking layer 27, an SCH-SAS LD which is excellent in oscillation threshold and stability of the lateral mode can be fabricated with a high yield.

The material of the mask 31 is not restricted to $SiO_2$. Any material such as SiN may be used as far as it can be selectively grown.

Figure 5A:
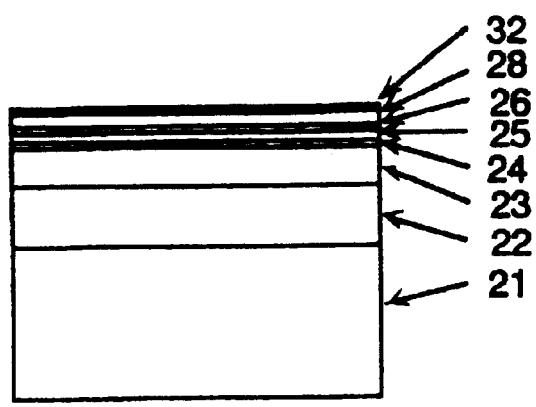
FIGS. 5A, 5B and 5C are section views showing fabrication steps of a sixth embodiment of the invention.
Figure 5B:
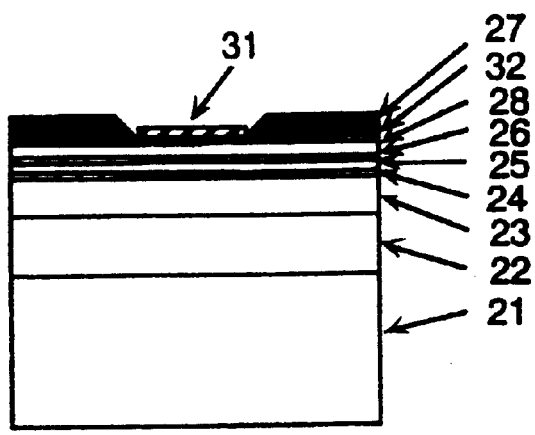
Figure 5C:
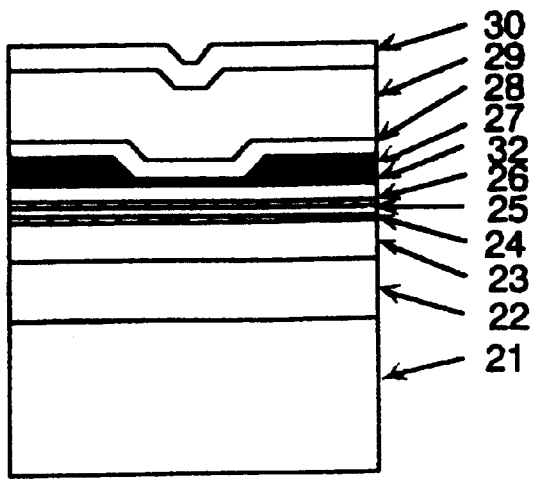
Figure 6:
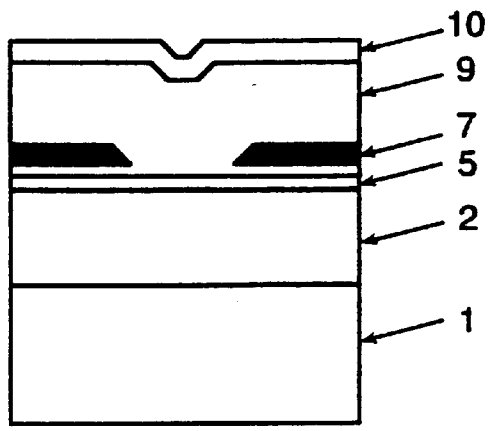
FIG. 6 is a view showing the configuration of an example of an SCH-SAS LD.
Figure 7:
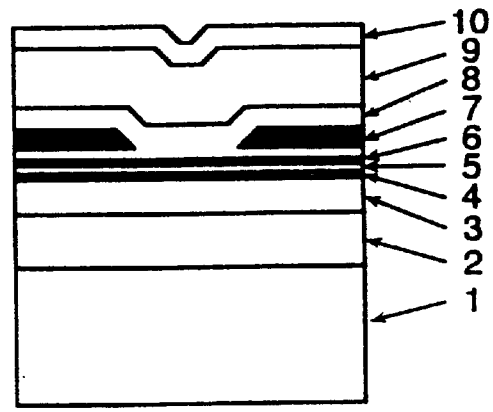
FIG. 7 is a view showing the configuration of an example of a PSCH-SAS LD.
Figure 8A:
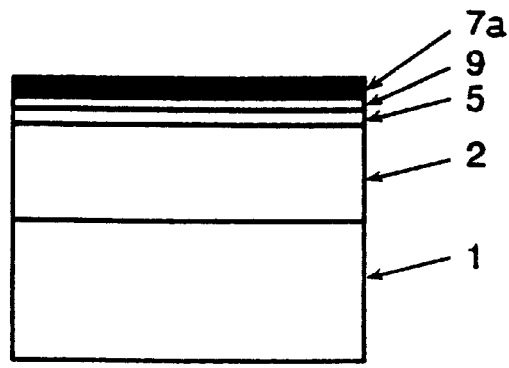
FIGS. 8A, 8B and 8C are views illustrating an example of a conventional method of fabricating the SCH-SAS LD.
Figure 8B:
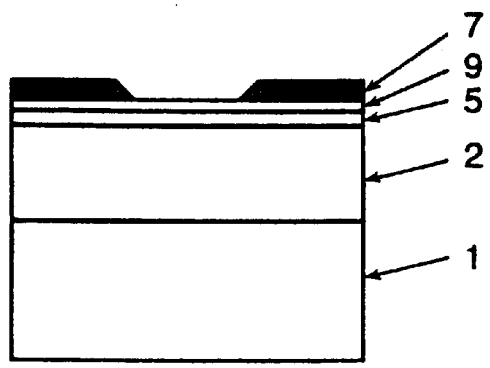
Figure 8C:
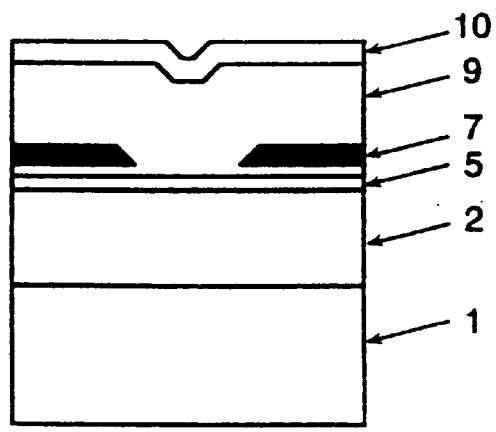
Figure 9A:
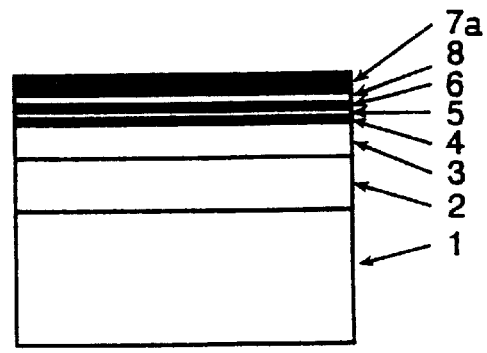
FIGS. 9A, 9B and 9C are views illustrating an example of a conventional method of fabricating the PSCH-SAS LD.
Figure 9B:
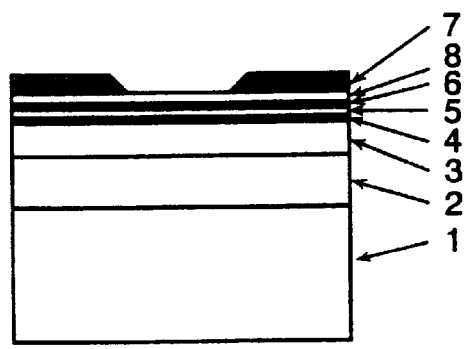
Figure 9C:
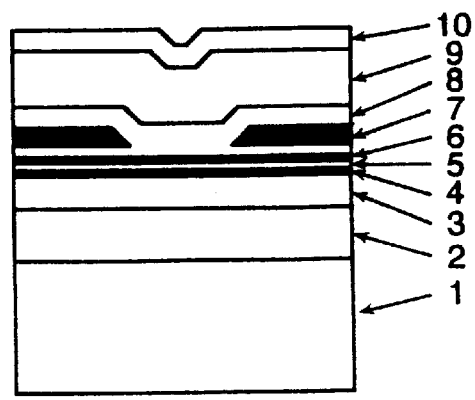

FIG. 5A, 5B and 5C are section views showing fabrication steps of a fifth embodiment of the invention. In the present embodiment, the explanation will made also by referring FIGS. 4A, 4B and 4C. As shown in FIG. 4A, first, a cladding layer 22 of n-$Al_{0.17}Ga_{0.83}As$ (thickness: 1.7 μm), an optical guide layer 23 of n-GaAs (thickness: 0.55 μm), a carrier blocking layer 24 of n-$Al_{0.30}Ga_{0.70}As$ (thickness: 0.030 μm), an $In_{0.2}Ga_{0.8}As$/GaAs quantum well active layer 25 (oscillation wavelength: 980 nm), a carrier blocking layer 26 of p-$Al_{0.30}Ga_{0.70}As$ (thickness: 0.030 μm) and a part of an optical guide layer 28 of p-GaAs (thickness: 0.10 μm) are sequentially crystal-grown on an n-GaAs substrate 21 by using an MOCVD or the like.

In an AlGaAs material, as the Al composition is higher, the bandgap tends to become wider. In the embodiment, the bandgap of the optical guide layers 23, 28 is wider than that of the quantum well active layer 25, and the bandgaps of the cladding layers 22, 29 and the carrier blocking layers 24, 26 are wider than that of the optical guide layers 23, 28.

The substrate on which the crystal growth has been performed as described above is taken out from a crystal growth apparatus and then loaded into an electron beam evaporation apparatus or the like so that, as shown in FIG. 4B, a mask 31 of, for example, $SiO_2$ is formed on the whole surface at a thickness of 0.1 μm. Thereafter, the mask is removed away except a center portion where a stripe-like window is to be formed, by using the photolithography technique, thereby forming the mask 31 into a stripe-like shape. Since the mask 31 is very thin, the stripe-like mask can be accurately formed with high reproducibility, even by the conventional photolithography technique.

Next, the substrate on which the mask 31 is formed is returned to the crystal growth apparatus, and a current blocking layer 27 of n-$Al_{0.08}Ga_{0.92}As$ (thickness: 0.15 μm) is selectively grown on the optical guide layer 28. As a result, as shown in FIG. 4B, a layer structure in which crystal growth is not performed in the region where the mask 31 is formed is obtained.

Thereafter, the mask 31 is removed away by a hydrofluoric acid aqueous solution or the like. As shown in FIG. 4C, then, the remaining part (thickness: 0.45 μm) of the optical guide layer 28 is crystal-grown, and further the cladding layer 29 of p-$Al_{0.17}Ga_{0.83}As$ (thickness: 1.7 μm) and a contact layer 30 of p-GaAs (thickness: 2.0 μm) are sequentially crystal-grown.

In this way, by using the technique in which the mask 31 is formed in the portion where the stripe-like window is to be formed, the current blocking layer 27 is then formed by selective growth, and the mask 31 is thereafter removed away, the dimensions of the stripe-like window of the current blocking layer 27 in the height and width directions can be accurately controlled with high reproducibility while suppressing maleffects on the other layers such as the active layer 25 or the carrier blocking layer 26. As a result of this selective growth of the current blocking layer 27, an SCH-SAS LD which is excellent in oscillation threshold and stability of the lateral mode can be fabricated with a high yield. In addition, owing to the GaAs guide layers, it is possible to avoid the effect of the deterioration due to the oxidation. As a result, a semiconductor laser of high reliability in which a barrier is not formed can be fabricated and realized.

The material of the mask 31 is not restricted to $SiO_2$. Any material such as SiN may be used as far as it can be selectively grown.

FIGS. 5A, 5B and 5C are section views showing fabrication steps of a sixth embodiment of the invention. As shown in FIG. 5A, first, a cladding layer 22 of n-$Al_{0.24}Ga_{0.76}As$ (thickness: 1.1 μm), an optical guide layer 23 of n-$Al_{0.20}Ga_{0.80}As$ (thickness: 0.88 μm), a carrier blocking layer 24 of n-$Al_{0.50}Ga_{0.50}As$ (thickness: 0.025 μm), a GaAs/$Al_{0.20}Ga_{0.80}As$ quantum well active layer 25

(oscillation wavelength: 860 nm), a carrier blocking layer 26 of p-$Al_{0.50}Ga_{0.50}As$ (thickness: 0.025 μm), an optical guide layer 28 of p-$Al_{0.20}Ga_{0.80}As$ (thickness: 0.10 μm), and a protective layer 32 of p-$In_{0.49}Ga_{0.51}P$ (thickness: 0.02 μm) are sequentially crystal-grown on an n-GaAs substrate 21 by using an MOCVD or the like.

In an AlGaAs material, as the Al composition is higher, the bandgap tends to become wider. In the embodiment, the bandgap of the optical guide layers 23, 28 is wider than that of the quantum well active layer 25, and the bandgaps of the cladding layers 22, 29 and the carrier blocking layers 24, 26 are wider than that of the optical guide layers 23, 28.

Since the protective layer 32 is formed of a material free of aluminum, it is possible to suppress the deterioration due to the oxidation.

The substrate on which the crystal growth has been performed as described above is taken out from a crystal growth apparatus and then loaded into an electron beam evaporation apparatus or the like so that, as shown in FIG. 5B, a mask 31 of, for example, $SiO_2$ is formed on the whole surface at a thickness of 0.1 μm. Thereafter, the mask is removed away except a center portion where a stripe-like window is to be formed, by using the photolithography technique, thereby forming the mask 31 into a stripe-like shape. Since the mask 31 is very thine the stripe- like mask can be accurately formed with high reproducibility, even by the conventional photolithography technique.

Next, the substrate on which the mask 31 is formed is returned to the crystal growth apparatus, and a current blocking layer 27 of n-$Al_{0.33}Ga_{0.67}As$ (thickness: 0.1 μm) is selectively grown on the optical guide layer 28. As a result, as shown in FIG. 5B, a layer structure in which crystal growth is not performed in the region where the mask 31 is formed is obtained.

Thereafter, the mask 31 is removed away by a hydrofluoric acid aqueous solution or the like. As shown in FIG. 5C, then, the remaining part (thickness: 0.78 μm) of the optical guide layer 28 is crystal-grown, and further the cladding layer 29 of p-$Al_{0.24}Ga_{0.76}As$ (thickness: 1.1 μm) and a contact layer 30 of p-Gas (thickness: 2.0 μm) are sequentially crystal-grown.

In this way, by using the technique in which the mask 31 is formed In the portion where the stripe-like window Is to be formed, the current blocking layer 27 is then formed by selective growth, and the mask 31 is thereafter removed away, the dimensions of the stripe-like window of the current blocking layer 27 in the height and width directions can be accurately controlled with high reproducibility while suppressing maleffects on the active layer 25 or the carrier blocking layer 26. As a result of this selective growth of the current blocking layer 27, an SCH-SAS LD which is excellent in oscillation threshold and stability of the lateral mode can be fabricated with a high yield.

In addition, by providing the protective layer 32 formed of $In_{0.49}Ga_{0.51}P$, it is possible to avoid the effect of the deterioration due to the oxidation. As a result, a semiconductor laser of high reliability in which a barrier is not formed can be fabricated and realized.

The material of the mask 31 is not restricted to $SiO_2$. Any material such as SiN may be used as far as it can be selectively grown.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of fabricating a self-aligned structure semiconductor laser comprising:
   providing a pair of cladding layers respectively on both faces of an active layer, the cladding layers having a bandgap wider than that of an active layer; and
   embedding a current blocking layer having a stripe-like window, in at least one of the cladding layers,
   wherein the current blocking layer is formed by selective growth.

2. A method of fabricating a self-aligned structure semiconductor laser comprising:
   providing an optical guide layer on one face or a pair of optical guide layers on both faces of an active layer, respectively, the optical guide layer(s) having a bandgap wider than that of the active layer;
   providing a pair of cladding layers so as to sandwich the active layer and the optical guide layer(s) therebetween, the cladding layers having a bandgap wider than that of the optical guide layer; and
   embedding a current blocking layer having a stripe-like window between at least one of the cladding layers and the optical guide layer(s),
   wherein the current blocking layer is formed by selective growth.

3. A method of fabricating a self-aligned structure semiconductor laser comprising:
   providing an optical guide layer on one face or both faces of an active layer, the optical guide layer having a bandgap wider than that of the active layer;
   providing a pair of cladding layers so as to sandwich the active layer and the optical guide layer therebetween, the cladding layers having a bandgap wider than that of the optical guide layer; and
   embedding a current blocking layer having a stripe-like window in at least one of the optical guide layer,
   wherein the current blocking layer is formed by selective growth.

4. A method of fabricating a self-aligned structure semiconductor laser of perfect confinement structure comprising:
   providing a pair of optical guide layers respectively on both faces of an active layer, the optical guide layers having a bandgap wider than that of the active layer;
   providing a pair of cladding layers so as to sandwich the active layer and the optical guide layers therebetween, the cladding layers having a bandgap wider than that of the optical guide layers;
   providing carrier blocking layers respectively between the active layer and the optical guide layers, the carrier blocking layers having a bandgap wider than those of the active layer and the optical guide layers; and
   embedding a current blocking layer having a stripe-like window in at least one of the optical guide layers,
   wherein the current blocking layer is formed by selective growth.

5. The method of fabricating a semiconductor laser of claim 1, wherein the current blocking layer is formed of $Al_xGa_{1-x}As$ having an Al composition x of $0 \leq x \leq 0.35$ or a semiconductor material free of aluminum.

6. The method of fabricating a semiconductor laser of claim 2, wherein the optical guide layer is formed of $Al_xGa_{1-x}As$ having an Al composition x of $0 < x \leq 0.3$.

7. The method of fabricating a semiconductor laser of claim 2, wherein the optical guide layer is formed of a semiconductor material free of aluminum.

8. The method of fabricating a semiconductor laser of claim 7, wherein the semiconductor material free of aluminum for forming the optical guide layer is GaAs.

9. The method of fabricating a semiconductor laser of claim 7, further comprising:

providing a substrate formed of GaAs, wherein the semiconductor material free of aluminum for forming the optical guide layer is InGaP or InGaAsP which can lattice-match with GaAs.

10. The method of fabricating a semiconductor laser of any one of claims 2 to 6, further comprising:

forming a protective layer of a semiconductor material free of aluminum between the optical guide layer and the current blocking layer.

11. The method of fabricating a semiconductor laser of claim 10, wherein the semiconductor material free of aluminum for forming the protective layer is GaAs.

12. The method of fabricating a semiconductor laser of claim 10, further comprising:

providing a substrate of GaAs, wherein the semiconductor material free of aluminum for forming the protective layer is InGaP or InGaAsP which can lattice-match with GaAs.

13. The method of fabricating a semiconductor laser of claim 6, wherein the active layer is formed of GaAs.

14. The method of fabricating a semiconductor laser of claim 6, wherein the active layer is formed of InGaAs.

15. The method of fabricating a semiconductor laser of claim 1, wherein any one of MOCVD (metalorganic chemical vapor deposition method), MOMBE (metalorganic molecular beam epitaxy method), and MBE (molecular beam epitaxy method) is used for the selective growth.

16. The method of fabricating a semiconductor laser of claim 1, wherein the selective growth comprises the steps of:

forming a mask for selective growth on a layer on which the current blocking layer is to be formed;

removing the mask for selective growth formed on the layer excluding a portion where the stripe-like window is to be formed;

forming the current blocking layer through crystal growth all over the layer excluding the portion for the stripe-like window; and removing the mask for selective growth on the portion for the stripe-like window.

* * * * *